US005311466A

United States Patent [19]
Natale et al.

[11] Patent Number: 5,311,466
[45] Date of Patent: May 10, 1994

[54] FLASH-EPROM WITH ENHANCED IMMUNITY FROM SOFT-PROGRAMMING OF REFERENCE CELLS

[75] Inventors: Virginia Natale, Milan; Gianluca Petrosino, Missaglia; Flavio Scarra, Agrate Brianza, all of Italy

[73] Assignee: SGS-Thomson Microelectronics s.r.l., Agrate Brianza, Italy

[21] Appl. No.: 783,690

[22] Filed: Oct. 30, 1991

[30] Foreign Application Priority Data
Oct. 31, 1990 [IT] Italy .................. 83644 A/90

[51] Int. Cl.$^5$ .................. G11C 11/34; G11C 17/00
[52] U.S. Cl. .................. 365/185; 365/182; 365/900
[58] Field of Search .......... 365/185, 230.06, 189.06, 365/181, 226

[56] References Cited
U.S. PATENT DOCUMENTS
4,807,188  2/1989  Casagrande .................. 365/185

FOREIGN PATENT DOCUMENTS
0224125A2  6/1987  European Pat. Off. .
0224125A3  6/1987  European Pat. Off. .
0377840A2  7/1990  European Pat. Off. .
0377840A3  7/1990  European Pat. Off. .

Primary Examiner—Eugene R. LaRoche
Assistant Examiner—Viet Q. Nguyen
Attorney, Agent, or Firm—Seed and Berry

[57] ABSTRACT

The probability of soft-programming of the reference cells of a FLASH-EPROM memory may be excluded by having a decoupling transistor of a type of conductivity opposite to that of the cells functionally connected between the gate of each reference cell and the respective row line. Moreover the elimination of the electrical stresses to which the reference cells are subjected during the repeated programming cycles of the memory cells, increases the stability of the respective reference values of threshold and current level provided by the reference cells, thus increasing the reliability of the device.

18 Claims, 1 Drawing Sheet

FLASH-EPROM WITH ENHANCED IMMUNITY FROM SOFT-PROGRAMMING OF REFERENCE CELLS

TECHNICAL FIELD

The present invention relates to a FLASH-EPROM memory matrix or more concisely to a FLASH memory with an enhanced immunity from soft-programming phenomena in the reference lines.

BACKGROUND OF THE INVENTION

FLASH memories are rapidly finding numerous new fields of application. Their success is primarily due to the relatively small dimension of the unit cell, which is about equal to that of a traditional EPROM cell, coupled to the ability of being electrically erased. These characteristics ideally place FLASH memories between traditional EPROM memories (less expensive) and the EEPROM memories (much more expensive) from which they differ be being electrically erasable although the erasing may be carried out exclusively on the whole memory matrix, while an EEPROM memory may be erased byte by byte. On the other hand, a typical EEPROM unit cell is about four times larger than a FLASH cell.

It is easily understood why the FLASH memories have conquered large sectors of the market where it is important to have nonvolatile, large-capacity memories which may be electrically erased but whose cost is relatively moderate.

One of the industrial sectors which is particularly interested to this type of memories is the automotive sector where on-board reprogramming of the memories is an indispensable requirement, e.g., for modifying the controlling parameters of a motor from time to time, or for recording the operating history of a motor between services, and the like.

Intrinsically a FLASH memory may develop specific programming disturbances, which make this type of memory very delicate from the point of view of the design of the circuitry for managing the memory matrix. The erratic programming phenomena known as "soft-programming" and a similar erratic erasing or "soft-erasing" to which the cells may frequently undergo, create remarkable programming problems for this type of memories from the pointer of view of these recurrent physical error mechanisms.

The organization in a matrix of rows and columns of the cells of a FLASH memory is schematically depicted in FIG. 1. Within row 1, there is a cell (A) which is to be programmed to store either the high state, "1," or a low state, "0." A cell (B) has already been programmed to store the high state, "1." A cell (C) is a virgin cell, that is, it has not been programmed. By soft-programming is meant an eventually unwanted programming which a virgin cell (C) may undergo when other cells (A) disposed on the same row of the virgin cell (C) are being programmed. If the total number of cells arranged on the same row is very large and if all the cells of the row are programmed in succession, the repeated electrical stresses induced by high programming voltages (12 V on the gate of the cell to be programmed) to which the virgin cell (C) is repeatedly subjected may lead to an unwanted programming thereof.

With reference to FIG. 1, by soft-erasing is meant the possibility that a programmed cell (B,D) may improperly be brought back to a condition of a virgin cell because of the repeated electrical stresses induced by high erasing voltages (12.5 V on the gate for the (B) cell, 6.5 V on the drain of the (D) cell) to which the programmed cell is subjected when the programming of a cell which is on the same row or column of said B and D cells is carried out. If the number of cells, rows and columns of the matrix is large, this error mechanism becomes even more relevant than that due to soft-programming because it has a more relevant overall effect than soft-programming.

In both cases, the physical mechanism through which soft-programming or soft-erasing takes place is the so-called Fowler-Nordheim current effect.

It has also been observed that the unit cells of the memory more subject to soft-programming are the cells of the reference columns (reference bit lines) of the matrix, which provide a reference of the threshold and current levels for reading by means of the sense-amplifier of the managing circuitry of the memory, the data stored therein. Moreover the repeated electrical stresses to which the reference cells are subjected have a negative influence on the stability in time of the relative threshold and current levels provided by the cells, thus often causing problems of reliability of the reading circuitry of these memories.

SUMMARY OF THE INVENTION

The objective of the present invention is that of providing a FLASH-EPROM memory which is substantially immune from the problem represented by soft-programming or by soft erasing of the reference cells of the memory matrix and wherein the reference values of threshold and of current level provided by the reference unit cells are substantially stable in time also after a large number of cycles (write-erase cycles) undergone by the memory. These objectives and associated advantages are achieved by the FLASH-EPROM memory object of the present invention, which comprises a decoupling transistor functionally connected between the gate of the reference cells and the relative row-line and wherein the body region of the decoupling transistor is connected to the supply rail Vcc and the gate of the decoupling transistor is connected to real ground. The decoupling transistor effectively limits the voltage which is applied to the gate structure of a respective reference cell during the programming of the cells belonging to the same row of the matrix, thus eliminating any significant electrical stress on the reference cell structure and preserving their condition of virginity and increasing the stability of the relative threshold and current level values even after a large number of write-erase cycles undergone by the memory.

DETAILED DESCRIPTION OF THE INVENTION

Figure 1:
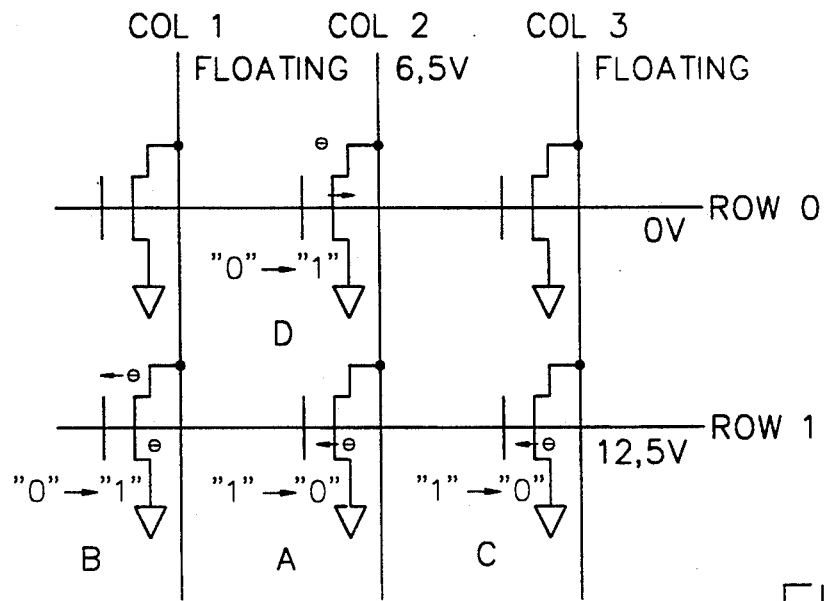
FIG. 1 represents, as already described, a matrix organization scheme of FLASH-EPROM memory useful for illustrating in general terms, the soft-programming and soft-erasing mechanisms.
Figure 2:
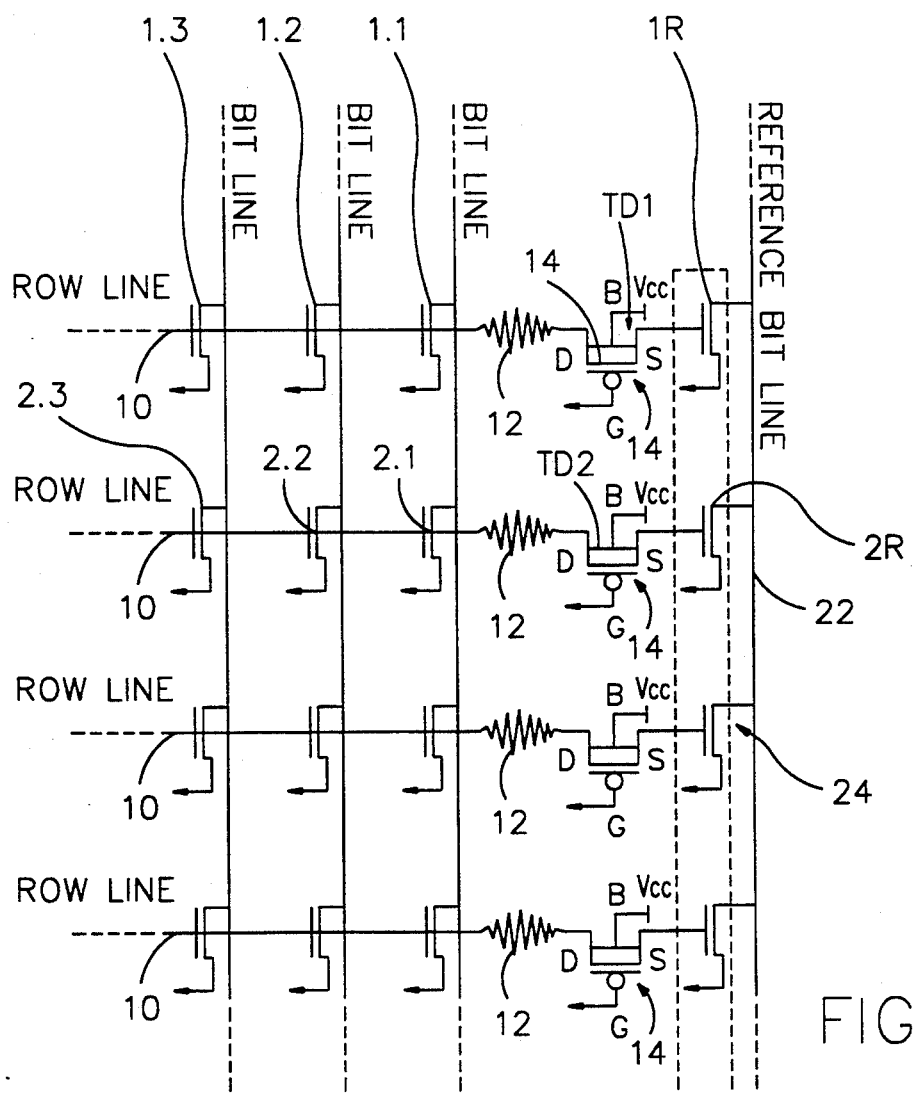
FIG. 2 is a circuit diagram representing a portion of a FLASH-EPROM memory matrix made in accordance with the present invention.

The fragmentary circuit diagram of FIG. 2 illustrates a FLASH-EPROM memory matrix made in accordance with the present invention, wherein a plurality of unit memory cells (1R, 1.1, 1.2, 1.3, 2R, 2.1, 2.2, 2.3, ...), integrated on a semiconducting substrate, are arranged in rows and columns. Each cell is generally a floating gate, three terminal device (transistor); namely having a drain, a control gate, (which may be physically formed over a first isolated, floating gate of the device) and a source terminal, as is well known in the art. As typical in these memory arrays, the sources of all the cells in the array are connected in common, normally to a virtual ground node, at least during the reading of data stored in the memory and to which virtual ground node a certain voltage may be applied when programming or erasing cells.

Each memory cell may be individually addressed through a first order of selectable byte- or word-lines 10 (row-lines) which connect the gates of the memory cells disposed along a same row of the matrix, respectively, and a second order of selectable lines (bit-lines) 20, commonly orthogonal to the row lines 10, which connect the drains of all the memory cells arranged along a same column, respectively. The memory cells arranged along a reference bit line 22 and forming a column of the matrix (1R, 2R, ...) are used as reference cells 24; customarily they are virgin cells. Their function is that of establishing a reference threshold and current level to be used for comparison by the attendant circuitry for reading the data stored in the memory. Commonly in a FLASH-EPROM memory matrix, a relatively high programming voltage, commonly 12 V is repeatedly applied on the row line 10 and thus on the gates of all memory cells in that row during programming. This voltage is thus also applied on the gate of the reference cells 24 every time a cell of the respective row 10 is programmed. These repeated electrical stresses often lead to a soft-programming error of the reference cell 24.

In the FLASH-EPROM of the invention, depicted in FIG. 2, soft programming errors of the reference cells 24 are prevented by adding a decoupling transistor 14 (TD1, TD2, TD3, ...) and a resistor 12 between the gate of each reference cell 24 and the respective row-line 10 of the matrix.

In the example shown in FIG. 2, the unit cells are n-channel, floating-gate, superficial field effect transistors of a conventional type for FLASH-EPROMS, as is well-known in the art. In one embodiment, the decoupling transistors 14 TD1, TD2, ..., are transistors of opposite conductivity; for n-channel memory cells, p-channel transistors. In one embodiment, the decoupling transistors 14 are enhancement mode, p-channel transistors.

Each decoupling transistor 14 has a source/drain connected to the control gate of the respective reference cell 24, a drain/source connected to the respective row-line 10, a gate connected to a real ground node, and a body region connected to the supply rail (Vcc) of the matrix. The supply rail will be maintained at no higher than 5 volts, thus holding the body region to 5 volts. The body region will generally be the well for the transistors. For a CMOS chip, p-channel transistors are in an N well, and thus the N well for the decoupling transistors 14 will not exceed Vcc, normally 5 volts. As is known in the art for an MOS transistor, the terms drain and source are relative terms, based on the voltage levels during operation. In some states, the drain may become the source and the source may become the drain; the locations of the source and drain as applied to transistor 14 are used for reference only and are to be understood interchangeable.

The decoupling transistor 14 and resistor 12 are capable of limiting the voltage which is applied to the gate of the reference cell 24 to a value of about 5 V instead of the full value of the programming voltage of about 12 V. The resistor 12 is coupled between the row line 10 and drain of the decoupling transistor 14. In one embodiment, the resistor 12 is formed in a diffused region in silicon, using techniques known in the art. The gates of the reference cells 24 cannot rise above 5 volts because the decoupling transistor clamps the drain to no higher than 5 volts, even if the row line 10 goes to a full 12 volts. The voltage drops from 12 volts to 5 volts across resistor 12 during programming. In this way, the electrical stress which is induced on the reference cells at every programming of a memory cell disposed on the same row of the particular reference cell, is negligible and practically eliminated, thus preventing any possibility of soft-programming of the reference cell 24. A further advantage is represented by an increased stability in time of the threshold and current level values provided by the reference cells 24, also after a large number of write-erase cycles undergone by the FLASH memory because of the practically negligible electric stresses to which the reference cells are exposed. In this way, the reliability of the erasing circuitry of the memory is greatly increased.

The resistor 12 has a sufficiently high value to limit the current flow through it while maintaining the proper voltage on the row line 10 during programming, sometimes as high as 12 volts. As will be appreciated, for a given voltage drop, such as 7 volts, the current flow will decrease for a higher resistor value. It is desirable to limit the drain to body current of the decoupling transistor 14 during programming, by having a relatively high value for the resistor 12, within the area limitation permitted on the chip.

We claim:

1. A FLASH-EPROM memory matrix composed of memory having families of selectable word lines and bit-lines, respectively, and comprising at least a column of individually selectable reference cells, characterized by comprising
at least a field effect transistor of a type of conductivity opposite to the type of conductivity of the memory cells of said memory, functionally connected between a control gate of each of said reference cells and a respective word line, said transistor being capable of limiting the voltage which is applied to the control gate of a reference cell during the programming of memory cells arranged in the same row of cells of said reference cell.

2. The FLASH-EPROM memory according to claim 1 wherein said memory cells are of n-channel conductivity type and said transistors that are functionally connected between the control gate structure of said reference cell and the respective word-line are of p-channel conductivity type.

3. The FLASH-EPROM memory according to claim 1 wherein each of said transistors has a source connected to the control gate of a respective reference cell, a drain connected to said respective word-line, a gate connected to a real ground node of the memory matrix and a body connected to a supply rail of the memory matrix.

4. In a FLASH-EPROM memory array, the improvement characterized by the presence of at least a field effect transistor of a type of conductivity opposite to the type of conductivity of the memory cells of said memory array, functionally connected between the control gate of a reference cell and a respective word-line of the memory array.

5. The FLASH-EPROM memory according to claim 4 wherein each of said transistors has a source connected to the control gate of a respective reference cell, a drain connected to said respective word-line, a gate connected to a real ground node of the memory matrix and a body connected to a supply rail of the memory matrix.

6. A FLASH-EPROM memory comprising a plurality of memory cells, each memory cell including a floating gate, field effect transistor of a first type of conductivity having a drain, a gate structure comprising a floating gate and a control gate, and a source, in a semiconducting substrate, organized in a matrix of rows and columns and individually addressable through at least two families of conducting lines, each line of a first family of lines connecting the control gates of the cells arranged along a same row of the matrix to a respective row selection circuitry, each line of said second family of lines connecting the drains of cells arranged along a same column of the matrix to a respective column selection circuitry, a line of said second family of lines connecting in common the drains of the cells of a column of reference cells, the sources of all the cells of the matrix being connected to a common source node which is maintained at a virtual ground potential at least during the reading of the data stored in memory;

characterized by comprising at least a field effect transistor of a type of conductivity opposite to said first type of conductivity functionally connected between the control gate of each of said reference cells of said column and each respective line of said first family of lines connecting the control gates of the memory cells that are connected to the same row, respectively, to said row selection circuitry; said transistor having a source connected to the control gate of a respective reference cell of said column of respective reference cells, a drain connected to said respective line of the first family of lines, a gate connected to a real ground node and a body connected to a supply rail of the memory;

said at least transistor limiting the voltage which is applied to the control gate structure of the respective reference cell of said column of reference cells during the programming of memory cells belonging in the same row.

7. The FLASH-EPROM memory according to claim 6 wherein said cells are of the n-channel conductivity type and said transistors functionally connected between the gate structure of each of said reference cells and the respective line of said first family of lines are of the p-channel conductivity type.

8. The FLASH-EPROM memory according to claim 1 further including a resistor connected between said field effect transistor and the respective word-line.

9. The FLASH-EPROM memory according to claim 8 wherein the resistor has a high value which is selected to ensure a low current flow through the resistor while maintaining the proper voltage on the word-line during programming.

10. The FLASH-EPROM matrix according to claim 4 further including an impedance device positioned between said field effect transistor and the respective word-line of the memory array.

11. The FLASH-EPROM memory according to claim 10 wherein the impedance device is a resistor having a selected high value to reduce the current that passes therethrough during programming.

12. A FLASH-EPROM memory array comprising:
a plurality of memory cells, each of said memory cells including a drain region, a gate structure, and a source region;
a plurality of reference cells, each reference cell having a gate;
a word-line electrically connected to the gate structure of a plurality of the memory cells within the memory;
a field effect transistor functionally connected between the gate of a respective reference cell and the respective word-line.

13. The FLASH-EPROM memory array according to claim 12 further including an impedance device positioned between the respective word-line and the field effect transistor to reduce the current flow through the field effect transistor.

14. The FLASH-EPROM memory array according to claim 13 wherein said impedance device is a resistor.

15. The FLASH-EPROM memory array according to claim 14 wherein the resistor is selected to have a high value to limit the current flow through the resistor to a low value while maintaining the proper voltage on the word-line during programming of the memory cells.

16. The FLASH-EPROM memory array according to claim 13 wherein each of said field effect transistors includes a source region connected to a gate of a respective reference cell, a drain region connected to said impedance device and the impedance device is connected to the word-line so as to provide a series electrical path from the word-line through the impedance device, and the drain region.

17. The FLASH-EPROM memory array according to claim 16 wherein the gate of said field effect transistor is connected to a ground node and the body is connected to a supply rail of the memory, the field effect transistor being of the P-conductivity type and the memory cells of the array being of the N-channel conductivity type, such that the field effect transistor is turned on but the source region of the field effect transistor cannot exceed a selected voltage.

18. The FLASH-EPROM memory array according to claim 17 wherein the selected voltage which may be applied to the gate of the reference cell cannot rise about 5 volts.

* * * * *

UNITED STATES PATENT AND TRADEMARK OFFICE
CERTIFICATE OF CORRECTION

PATENT NO. : 5,311,466
DATED : May 10, 1994
INVENTOR(S) : Virginia Natale et al.

It is certified that error appears in the above-identified patent and that said Letters Patent is hereby corrected as shown below:

In claim 1, column 4, line 41, after "memory" and before "having", please insert --cells--.

In claim 6, column 5, line 18, after "a source," and before "in a", please insert --integrated--.

In claim 6, column 5, line 56, please delete "in" and substitute therefor --to--.

Signed and Sealed this

Twenty-seventh Day of September, 1994

Attest:

BRUCE LEHMAN

Attesting Officer     Commissioner of Patents and Trademarks